United States Patent [19]

Ahmed

[11] 4,140,977
[45] Feb. 20, 1979

[54] SIGNAL TRANSLATION CIRCUITS
[75] Inventor: Adel A. A. Ahmed, Annandale, N.J.
[73] Assignee: RCA Corporation, New York, N.Y.
[21] Appl. No.: 869,638
[22] Filed: Jan. 16, 1978
[51] Int. Cl.² .............................................. H03F 3/14
[52] U.S. Cl. .................................................. 330/288
[58] Field of Search ................ 330/257, 288; 307/296; 323/4

[56] References Cited
U.S. PATENT DOCUMENTS

| | | | |
|---|---|---|---|
| 3,553,486 | 1/1971 | Dow | 307/237 X |
| 3,717,821 | 2/1973 | Amemiya et al. | 330/288 X |
| 3,947,704 | 3/1976 | Blauschild | 330/257 X |

Primary Examiner—James B. Mullins
Attorney, Agent, or Firm—H. Christoffersen; Samuel Cohen

[57] ABSTRACT

These circuits include a current mirror amplifier (CMA) having an input (master) transistor and at least one output (slave) transistor. The signal translation input circuit comprises a third transistor having a base-emitter junction connected between the input and common terminals of the CMA and a signal voltage input terminal at the collector of the third transistor. The output current of the mirror is a function of the signal voltage applied to this signal voltage input terminal.

24 Claims, 8 Drawing Figures

SIGNAL TRANSLATION CIRCUITS

The present invention relates to signal translation circuits.

There is a frequent need in circuit design for translating a signal voltage at one level to a voltage at a second level or to an output current at a desired voltage level. The circuits of the present application make use of an effect which had been considered undesirable, and which was not very well understood, to obtain such signal translation.

In the drawing, in which similar reference numerals are employed to identify similar circuit elements:

Figure 1:
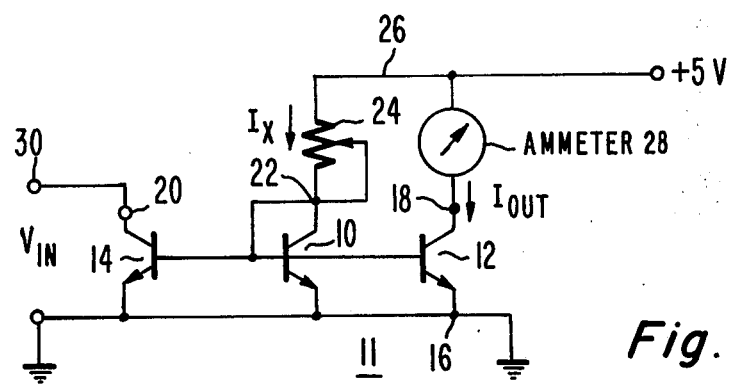
FIG. 1 is a schematic circuit diagram of a test circuit designed by the present inventor to measure the effect above.

The circuit of FIG. 1 comprises a current mirror amplifier (CMA) 11 formed of NPN transistors. Transistor 10 comprises the input (master) transistor of the CMA and it is connected base-electrode-to-collector-electrode in conventional fashion. Transistor 12 comprises the output (slave) transistor of the CMA and it is connected at its base to the base of transistor 10 and at its emitter to the emitter of transistor 10 and to a point of reference potential, shown as ground. This common ground connection 16 comprises the common terminal of the CMA. The collector of transistor 12 connects to output terminal 18 of the CMA. The input terminal 22 of the CMA is at the collector of transistor 10 and it connects through a current source, shown as a variable resistor 24, to the voltage supply rail 26 which may be at, for example, +5 volts. The output terminal 18 of the CMA also connects to the supply rail 26 through a current measuring means shown as an ammeter 28.

Transistor 14, rather than being a second output transistor of the CMA instead serves as the signal translation circuit input transistor. It is connected at its base to the bases of the other transistors and at its emitter to the CMA common terminal 16. In the present circuit, terminal 20, rather than serving as a second output terminal of the CMA, connects instead to a signal input terminal 30. A signal source $V_{IN}$ is connected between this input terminal and common terminal 16.

Before discussing the operation of the circuit of FIG. 1, it may be in order briefly to mention what was known previously to the present inventor. It has been observed by the present inventor and his co-workers that in circuits which included a CMA with two output terminals and in which the design permitted one of these output terminals to be disconnected from the operating voltage source, or where one of the output transistors was allowed to saturate by providing it with a current supply which would become inadequate to meet the current demand of the CMA, that the mirroring action between the input transistor (such as 10) and another output transistor (such as 12) was impaired. The effect was not well understood and was not made use of so far as the present inventor is aware. In fact, the effect was considered to be a nuisance and more or less elaborate means were proposed by the present inventor to lessen or avoid it. For instance, resistors may be included in series with the transistor bases to reduce the effect. So-called "catcher" diodes which are referenced to a voltage and are poled to conduct a current to satisfy the CMA demand when the load is disconnected may alternatively be employed. As a third alternative, cascoding may be used to prevent saturation of the CMA output transistors whenever current available from the load falls below the CMA demand.

The present inventor theorized whether the effect above, which up to now has only been found to be a hindrance to proper circuit operation, might be used to advantage. To test this theory, he constructed the circuit of FIG. 1 to measure the effect and, even more, to determine in a quantitative way the precise relationship which might exist between the condition of, and voltage at, terminal 30 and the current at terminal 18, and to determine whether such a relationship might be put to use. The results are shown in Table I below. Each row of the table represents a different value of input current $I_X$ supplied to the input terminal 22 of the CMA. For example, the first row of the table represents minimum input current $I_X$ to the CMA and this minimum input current is obtained by placing the maximum value of resistance 24 in the circuit. With each succeeding row of the table, the input current $I_X$ supplied to input terminal 22 is increased by reducing the amount of series resistance 24 between the voltage supply rail 26 and the input terminal 22. For each value of input current $I_X$, the current $I_{OUT}$ was measured with terminal 30 open circuited, with terminal 30 effectively short circuited to ground (0 volts) and with other values (10mV . . . 100mV) of voltage applied to terminal 30.

TABLE I

| $V_{IN}$ | OPEN | 0 | 10 mV | 30 mV | 50 mV | 100 mV | 1 V |
|---|---|---|---|---|---|---|---|
| | 0.5 | 0.4 | .90 | 1.0 | 1.0 | 1.0 | 1.0 |
| | 2.3 | 2.1 | 2.5 | 3.5 | 4.1 | 4.9 | 5.0 |
| | 5.0 | 4.1 | 4.9 | 6.7 | 8.1 | 9.6 | 10.0 |
| $I_{OUT}$ | 13.6 | 12.8 | 15.3 | 20.3 | 24.2 | 28.9 | 30.0 |
| | 23.5 | 22.2 | 26.3 | 34.0 | 40.3 | 48.0 | 50.0 |
| μA | 50.5 | 48.5 | 55.7 | 69.4 | 80.6 | 95.7 | 100.0 |
| | 176 | 173 | 189 | 220 | 243 | 283 | 300 |
| | 315 | 309 | 332 | 373 | 407 | 464 | 500 |

It may be observed from Table I above that as the input voltage is increased, for example from 0 volts to 1 volt, the output currrent $I_{OUT}$ is increased by roughly a factor of two over the entire input current range $I_X$ of the operation. Actually, for values of current $V_{IN}=0$ volts, of less than 50 microamperes (μA), the increase in current when the input signal is changed to 1 volt is somewhat greater than a factor of two and for the larger values of current shown, the increase is somewhat less than by a factor of two.

The operation observed, as discussed above, and as shown in Table I, is postulated to be due to the following effects. It is believed that when the collector of transistor 14 is at 0 volts, that is, when it is effectively connected to the emitter electrode of transistor 14 that there are two forward-biased semiconductor junctions in shunt with the base-emitter junction of transistor 10; one is the base-emitter junction of transistor 14 and the other is the base-collector junction of transistor 14. The shunting effect of the additional forward-biased junction, that is, the collector-base junction, is to reduce the current density passing through the base-emitter junction of transistor 10 or, thought of another way, to reduce the base-emitter voltage of transistor 10. The effect is similar to what would occur if the area of the base-emitter junction of transistor 10 were increased. The result of the reduced current density through the base-emitter junction of transistor 10 is a reduction in the output current flow $I_{OUT}$ as observed in the table.

When the collector of transistor 14 is open circuited, this collector does not really "float." Rather, the current demand of transistor 14 pulls its collector to a voltage level ($V_{SAT}$ of transistor 14) which is close to ground. Transistor 14, in other words, is operating in saturation. As the collector electrode of transistor 14 is essentially at ground level, the circuit operates very similarly to having the collector of transistor 14 short circuited to its emitter electrode and this explains the close values of current flow in Table I for the open and short circuited conditions of the collector electrode.

As the collector voltage of transistor 14 is increased, less current flows into the base of transistor 14 in view of the reduced forward bias of the collector-base junction and the current density through the base-emitter junction of transistor 10 increases and the output current $I_{OUT}$ increases correspondingly. Eventually, a point is reached at which normal current mirror action occurs, that is, assuming equal base-emitter junctions for transistors 10 and 12, when the voltage at input terminal 30 becomes sufficiently high, the output current $I_{OUT}$ will become equal to the input current $I_X$.

In all of the cases discussed above, the variation of input voltage $V_{IN}$ at the collector electrode of transistor 14 does not appreciably affect the current $I_X$. Once $I_X$ is set to a particular level, it remains at close to that level for the various values of input voltage applied to terminal 30. In other words, any change in $I_X$ is a second order effect. The variation in output current $I_{OUT}$ observed is not due to variation in $I_X$ with changes in $V_{IN}$ but rather is believed to be due to the shunting effect of the forward-biased, base-collector junction of transistor 14, as discussed above.

Figure 2:
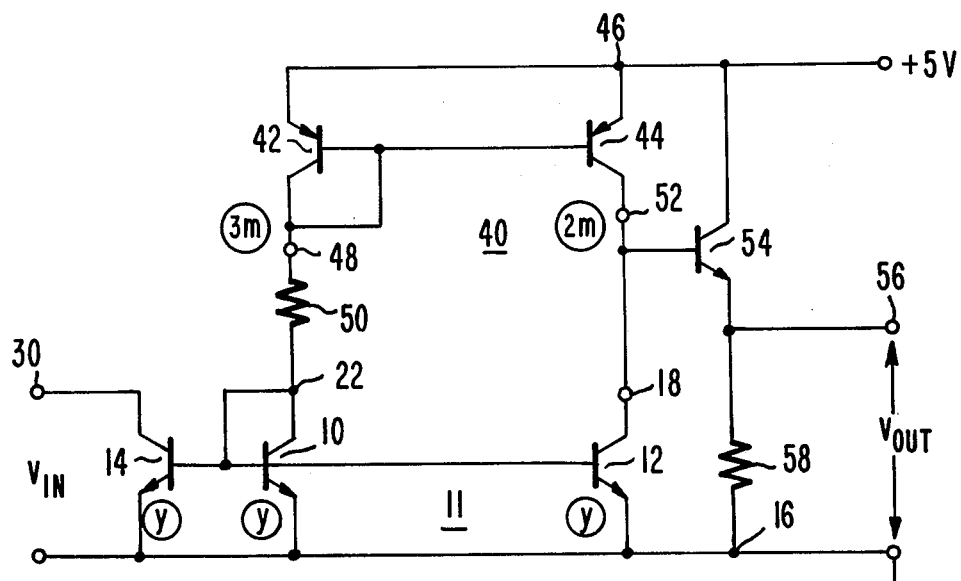
FIGS. 2, 3 and 4 are schematic circuit diagrams of signal translation circuits embodying the invention.

FIG. 2 illustrates a voltage translation circuit which includes transistors 10, 12 and 14 which are analogous to the same numbered elements in FIG. 1. The circuit also includes a second current mirror amplifier 40 formed of PNP transistors 42 and 44. The common terminal 46 of CMA 40 connects to the +5 volt operating voltage source and to the emitters of transistors 42 and 44. Input transistor 42 is connected collector-electrode-to-base-electrode to the input terminal 48 of CMA 40. This input terminal connects through resistor 50 to the input terminal 22 of the CMA 11. The output transistor 44 of CMA 40 is connected at its base electrode to the base electrode of transistor 42 and at its collector electrode to output terminal 52 of CMA 40. This output terminal connects to output terminal 18 of CMA 11 and to the base of NPN output transistor 54. The collector of transistor 54 connects to the positive operating voltage source and the emitter of this transistor connects to circuit output terminal 56 and through resistor 58 to the common terminal 16 of CMA 11.

The encircled letters and numbers in FIG. 2 represent the relative base-emitter junction areas of the various transistors. In general, it is advantageous for the ratio of $A_{44}/A_{42}$ to be greater than the ratio $A_{10}/A_{12}$, where A represents the base-emitter junction area and the subscript identifies the transistor. For example, the base-emitter junction area (3m) of transistor 42 relative to that (2m) of transistor 44 may be in the ratio of 3:2, as shown by the circled characters. What this means, in effect, is that for a given input current 3I, flowing out of input terminal 48, the mirroring transistor 44 will produce an output current 2I, when its collector is operated out of saturation. In this case, the transistors of CMA 11 may all have the same base-emitter junction area, equal to y, as illustrated, where y may be a value roughly in the same range as 3m. Alternatively, in some applications it may be advantageous to make some of the transistors of CMA 11 have different base-emitter junction areas than others. For example, if transistor 14 is made with a larger junction area than transistor 10, the reduction in output current from transistor 12 consequent on lowering of the collector voltage of transistor 14, will be greater than would be the case for equal base-emitter junction areas for transistors 10 and 14.

In operation of the circuit of FIG. 2, the input current supplied by input transistor 42 of CMA 40 flows into the input terminal 22 of CMA 11. The output current flowing from the output terminal 52 of CMA 40 has two possible current paths in which to flow. One is into the output terminal 18 of CMA 11 and the other is through the base-emitter junction of transistor 54.

When the input voltage $V_{IN}$ is relatively low, the collector-base junction of transistor 14 is forward biased, and diverts a portion of the current flowing from the self-biased transistor 42 and resistor 50. This lowers the emitter-to-base voltage of transistors 10 and 12. This reduces the current demand of transistor 12 and prevents it from accepting more than a relatively small amount of current which is available from the output terminal 52 of CMA 40. Such operation may be predicted from Table I above. At the same time, the current flow through self-biased transistor 42 and resistor 50 continues substantially undisturbed so CMA action between transistors 42 and 44 continues to make substantially the same current available from terminal 52. Since transistor 12 is conditioned for low conduction, the major portion of this current flows into the base-emitter junction of transistor 54, turning this transistor on. Transistor 54 is operated as a source follower and the current flowing through its emitter load 58 produces an output voltage $V_{OUT}$ at terminal 56 proportional to this current flow.

As the input voltage $V_{IN}$ to the circuit of FIG. 2 is increased, the shunting effect of the collector-base junction of transistor 14 is reduced and the output transistor 12 of CMA 11 will accept more and more current. A point will soon be reached at which the output transistor 12 will demand all (and then more than all) of the output current available at output terminal 52 of CMA 40. This will happen since the normal gain of CMA 11 is 1 while that of CMA 40 is 2/3, and both CMA's are supplied with equal input currents through resistor 50. As CMA output transistor 12 diverts more and more current away from the base of output transistor 54, the emitter-to-collector current of transistor 54 will decrease as will the output voltage. When the input voltage $V_{IN}$ passes a certain threshold value, transistor 12 will saturate and clamp the base of transistor 54 to ground, the base current flow to transistor 54 will reduce to zero and the output voltage $V_{OUT}$ also reduces to zero.

The operation described above has been measured and the various input and output voltages are recorded in Table II below. Note that a 30 millivolt (mV) input change is translated to a 3.75 volt output voltage change. Note also that the circuit of FIG. 2 operates as an inverting amplifier.

TABLE II

| $V_{IN}$ | $V_{OUT}$ |
|---|---|
| 1 mV | 3.75 V |
| 3 mV | 3.5 V |
| 10 mV | 2.4 V |
| 15 mV | 1.6 V |
| 20 mV | 0.88 V |
| 30 mV | 0 |

Figure 3:
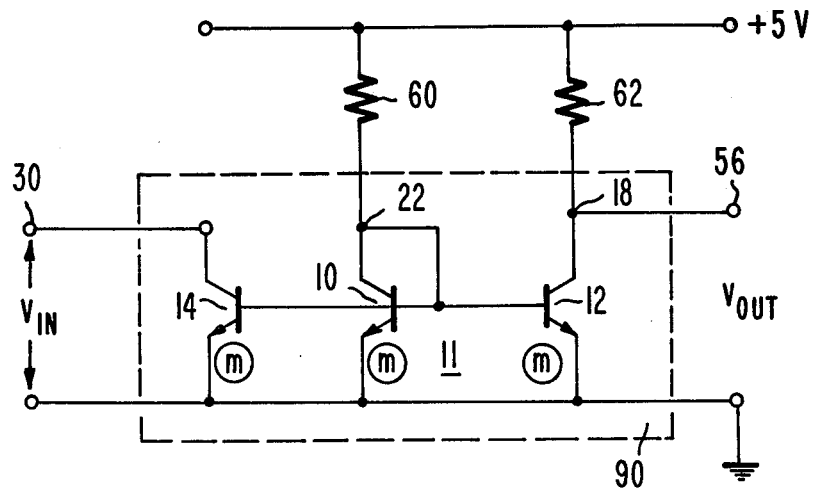

FIG. 3 illustrates an embodiment of the invention in which the current mirror amplifier 40 is replaced with two current sources, shown as resistors 60 and 62. The output voltage is taken from the output terminal 18 of the CMA 11. This circuit, like the one of FIG. 2, operates as an inverter.

Figure 4:
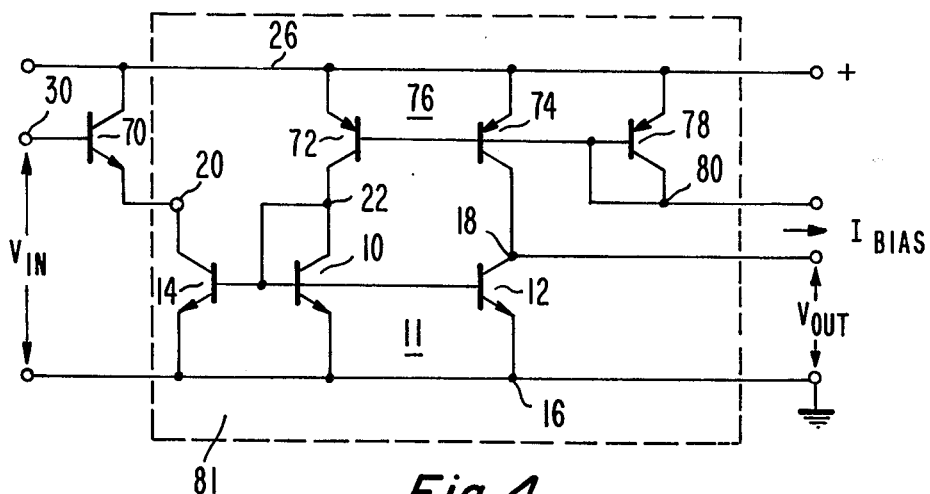

FIG. 4 illustrates another embodiment of the invention. Here, the input signal $V_{IN}$ is applied to the base of an NPN transistor 70. The emitter of this transistor connects to the CMA 11 output terminal 20 at the collector of output transistor 14 of CMA 11. The collector electrode of transistor 70 connects to the positive potential operating voltage rail 26. The current sources for the CMA transistors 10 and 12 comprise the output transistors 72 and 74, respectively, of a current mirror amplifier 76. The input transistor for this amplifier comprises transistor 78 which is connected at its base electrode to its collector electrode. The transistors of CMA 76 all comprise PNP transistors. The input current for CMA 76 is supplied from a current bias source $I_{BIAS}$ to the input terminal 80 of CMA 76. The transistors of CMA 76 may all have the same base-emitter junction area m; in this case, the output transistor 12 of CMA 11 will have a larger base-emitter junction area than that of input transistor 10 and the latter may have the same area as transistor 72. Conversely, transistors 10 and 12 may have equal areas and in this case transistor 72 of CMA 76 should have a larger base-emitter junction area than transistor 74 of CMA 76. As another alternative, the required ratio may be arrived at by the composite effect of non-unity ratios in CMA's 72 and 11.

The operation of the circuit of FIG. 4 is analogous to that of the circuits of FIGS. 2 and 3. When $V_{IN}$ is of relatively low value, the threshold of transistor 70 is not overcome and there is no base-emitter current flow through this transistor. Transistor 70 is therefore off and this simulates the condition of Table I above, of the output terminal 20 of CMA 11 connected to an open circuit. In this condition, the output transistor 12 of the CMA draws little current and acts like a high impedance between output terminal 18 of the CMA and ground. Accordingly, the output voltage $V_{OUT}$ is of a relatively high value. On the other hand, when $V_{IN}$ increases to a value somewhat greater than 1 $V_{BE}$, where $V_{BE}$ is the threshold voltage of transistor 70, transistor 70 turns on and the CMA 11 begins to operate more like a normal current mirror amplifier. In this condition, the output transistor 12 mirrors the current drawn by the input transistor 10 and the output voltage $V_{OUT}$ drops to a relatively low value.

The circuit of FIG. 4 has particular utility as a logic circuit. In this application the input signal $V_{IN}$ represents a binary digit. Assume that a 1 level is normally a volt or so and that anything greater than roughly 0.6 volt is assumed to represent a 1. The circuit operates so that when the input voltage $V_{IN}$ is greater than approximately 0.6 volt, the output $V_{OUT}$ is a low voltage level representing binary 0 and when the input voltage $V_{IN}$ is lower than the threshold level, $V_{OUT}$ is at a high level representing binary 1. In this particular circuit the high level may be of the order of 3-4 volts or so depending upon the circuit design. So this particular logic circuit can be considered an inverting buffer for translating the signal in the range of 0 to 1 volt to an output signal in the range of 3-4 volts to 0 volts.

Figure 7A:
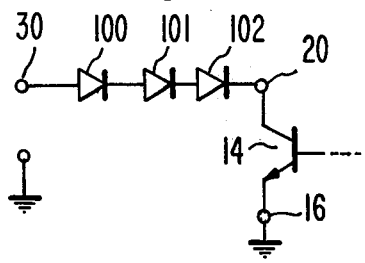
FIGS. 7a and 7b are schematic diagrams of circuit modifications which may be incorporated in the circuits above.
Figure 7B:
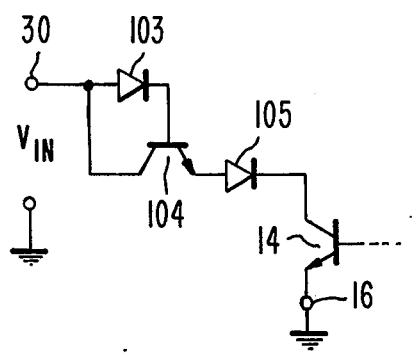

With minor modification, the input voltage range of the circuit can be modified, that is, the threshold of the circuit can be changed. For example, one or more diodes can be placed in series between the input terminal 30 and the base of transistor 70, poled in the same direction as the emitter-base junction of transistor 70, for increasing the threshold of the circuit. In similar fashion, the circuits of FIGS. 2 and 3 can be modified to increase the threshold of these circuits in the manner shown in FIGS. 7a and 7b. In FIG. 7a, three series-connected diodes 100, 101 and 102 are employed to increase the threshold of the circuit to a value somewhat greater than $3V_{BE}$. In FIG. 7b, a similar effect is achieved by employing a diode 103 across the collector-to-base junction of NPN transistor 104. The emitter of this transistor is connected to the anode of another diode 105 and the cathode of this diode is connected to the output terminal 20 of the CMA 11.

In the operation of the circuit of FIG. 7b, when the input voltage $V_{IN}$ applied to terminal 30 exceeds a value somewhat greater than $3V_{BE}$, conduction occurs from input terminal 30 to the output terminal 20 and through the collector-to-emitter path of transistor 14. The result of this current flow is similar to that which already has been discussed at length.

FIGS. 7a and 7b are merely to illustrate that the input threshold to the circuits already described readily can be changed to permit the circuits described to be employed in a large number of buffer applications. To give one example, this circuit would be useful for accepting inputs from a complementary-symmetry-metal-oxide-semiconductor (COS/MOS) logic circuit or from a transistor transistor logic circuit ($T^2L$) and for translating that voltage (which may be in the range of 0 to several volts) to an output current at a level of say $1V_{BE}$. In this application, the output terminal 18 of the circuit can be connected, for example, to the base electrode of an NPN transistor (not shown but which may be similar to transistor 96 of FIG. 6) of a current mode logic ($I^2L$) stage. The emitter electrode of this transistor may be connected to ground. In the operation of this circuit, when the current available at 18 flows into the base electrode of this NPN transistor, $V_{OUT}$ is clamped to a level of $1V_{BE}$.

Figure 5:
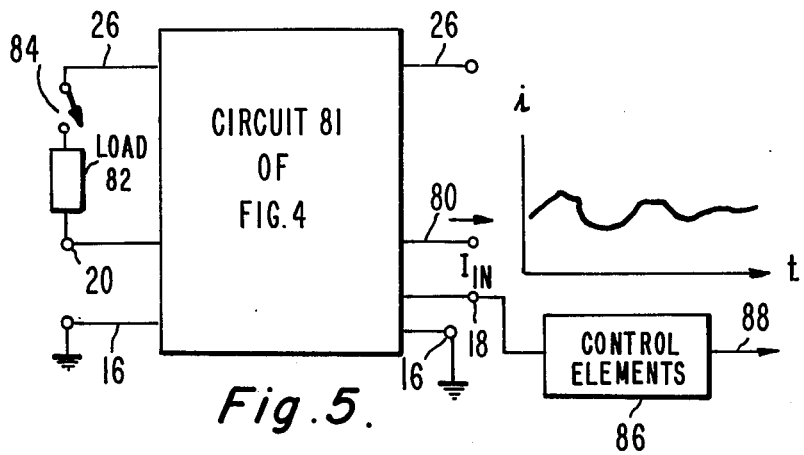
FIG. 5 is a block diagram of a signal current translation circuit embodying the invention.

FIG. 5 shows a modification of the circuit of FIG. 4 which is useful as a dual-function input/output terminal. The block represents the portion 81 of the circuit of FIG. 4. There is substituted for $I_{BIAS}$ of FIG. 4, a signal current input terminal at 80. The signal current comprises a current superimposed on a DC level, as illustrated, as is commonly the case in integrated circuit signals, so that the total current flow from input terminal 80 is unidirectional. The load 82 and switch 84 replace the transistor 70 of FIG. 4.

In the operation of the circuit of FIG. 5, when the switch 84 is closed, the variations in the input current $I_{IN}$ applied to input terminal 80, cause corresponding variations in the output current of transistor 72 (see FIG. 4). The output current of transistor 72 serves as the input current of CMA 11 and the variations in this input current cause corresponding variations in the output current at terminal 20 of the CMA 11. Thus, such current variations appear as load current variations in the current passing through load 82. In other words, with the switch closed, a replica of the input current $I_{IN}$ will flow through the load 82. However, if the switch 84 is opened, removing the load 82 from the circuit, the effect is the same as that obtained when open circuiting the collector electrode of transistor 14 of FIG. 4. As may be observed from Table I, when the collector is open circuited, the output current flowing into output terminal 18 of CMA 11 drops to a low value and the voltage at 18 rises to a high value. This high voltage at 18 is applied to the control elements 86 which can be employed for producing an output control voltage at 88. The control elements may be any one of a number of transistorized circuits responsive to the voltage 18 for producing a suitable output at 88. The control elements 86 may advantageously include a clamping element which serves to prevent the voltage at terminal 18 from falling to very low values, for example, 0.5 volts or less. Such a clamping element may be a diode referenced to a source of low potential. The effect will be to prevent output transistor 12 of CMA 11 in FIG. 4 from saturating which would otherwise alter the current gain of the CMA. This represents a case where an effect which is exploited to advantage in various embodiments of the invention which have been discussed appears as a drawback in this particular function of the circuit. Although this is not essential to the operation of the circuit of FIG. 5, it is sometimes desirable to be able to relate the overall gain from terminal 80 to the load 82 by geometry ratios only.

The circuit of FIG. 5 has a number of practical applications. In one such application, the switch 84 is remotely controlled. When in response to a signal from the remote control unit the switch is opened, it is desired to reduce the power dissipation of the circuit and in this use, the control voltage at 88 may be employed to perform this function. It can do this by removing (or reducing) the power supply voltage, for example.

In a second application of the circuit, the load 82 may represent a loudspeaker or other form of alarm such as a buzzer or the like and the switch 84 may represent a winding which is fragile or some other series circuit element which sometimes becomes defective and operates as an open circuit. The input current applied to 80 may include a DC component which is always present and an AC component which is produced in response to some conditions such as the presence of fire or smoke. In the operation of this circuit, the DC component of the input current is too low to activate the alarm but is sufficiently high that the output voltage at 18 is relatively low. When an alarm condition is detected, that is, when the AC component suddenly increases in magnitude, the load current increases correspondingly and activates the loudspeaker, buzzer or other alarm. The voltage at 18 remains low when this occurs so that the control elements 86 remain inactive. On the other hand, if there should be a defect in the circuit, represented by the opening of switch 84, the voltage at 18 will increase substantially, causing the control elements 86 to be activated and to produce an output control voltage at 88. This control voltage may be employed to activate a visual indicator (not shown) or an audible alarm (not shown) for indicating to the user that there is a problem.

In still another mode of operation, load 82 may simply be a resistor or the like and again the switch 84 a series element in an alarm device, which series element is a weak link in the sense that under certain conditions it can open and remain open. The input current applied to terminal 80 again can be a steady DC level with superimposed AC to represent an alarm condition. However, the latter is now represented by a large negative AC swing. In the operation of this circuit, when a large relatively negative swing occurs, the current passing through the load 82 reduces correspondingly and the voltage at terminal 20 decreases correspondingly. This decrease in voltage causes an increase in the output voltage at 18 and results in the production of a relatively high control voltage by the control elements 86. This control voltage at 88 may be employed to sound an alarm (not shown) or to activate visual indicator (not shown). In similar fashion, if the switch 84 should open, the control elements 86 again will produce a high output voltage to cause the indicator, such as an alarm, to be activated. This system is inferior to the one described above in that the sounding of an alarm is ambiguous. However, there is a saving of one alarm device as a common such device performs two functions, namely indicating a circuit failure and indicating the alarm conditions such as the presence of smoke or fire.

Figure 6:
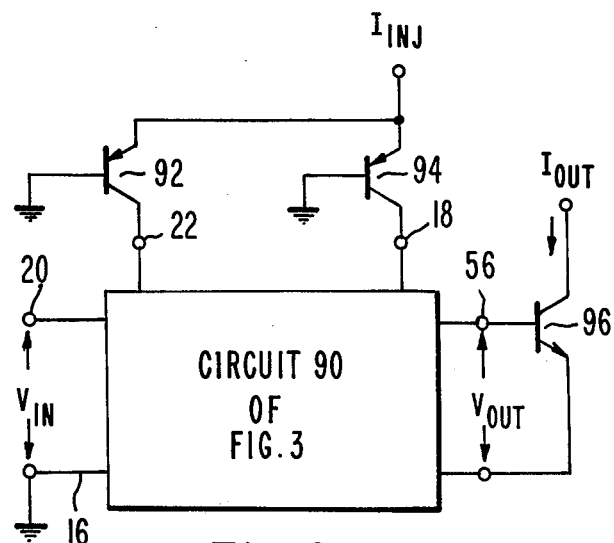
FIG. 6 is a block and schematic circuit diagram of a modified form of the circuit of FIG. 3.

A final modification for the circuit is illustrated in FIG. 6. Here the current supply for the CMA 11 of FIG. 3 comprises a portion of a current mode logic circuit known a $I^2L$. This circuit comprises a current source $I_{INJ}$, supplying current to the emitters of two PNP transistor 92 and 94 operated in the common base mode. The collectors of these transistors supply the input current for input terminal 22 of the CMA 11 and the output current for the output terminal 18 of CMA 11, respectively. The output circuit comprises NPN transistor 96 which is connected at its base to output terminal 18 of the CMA and at its emitter to ground. The output of this circuit comprises a current, namely the collector current of transistor 96.

In the operation of the circuit of FIG. 6, when the input voltage $V_{IN}$ is low, the output current drawn by CMA 11 is low and the voltage at terminal 18 is high, turning on transistor 96. This causes a relatively high collector current $I_{OUT}$ to flow into transistor 96. When $V_{IN}$ increases to greater than a given value, the collector current of transistor 94 flows in its entirety into the collector of transistor 12 of CMA 11, leaving no base current available for transistor 96. This turns off transistor 96 and the circuit output current $I_{OUT}$ reduces to zero.

While the present invention has been illustrated in terms of a particular type of CMA of given conductivity type, it is to be understood that this is intended as an example only as there are many modifications which are possible which are within the scope of the invention. As examples, the CMA may be formed of PNP transistors or of field effect transistors such as MOS transistors, and other forms of CMA's may be substituted for the one illustrated. In the case of field effect transistor CMA's, it is desirable to add in series with the base-emitter junction of transistor 14 voltage dropping means, such as series-connected diodes, to make the input circuit compatible in voltage level with the input (master) transistor input voltage level (between the input and common terminals of the CMA).

The various circuits illustrated are preferably all fabricated as integrated circuits.

What is claimed is:
1. A signal translation circuit comprising:
first and second current sources;
first and second operating voltage terminals;

a first current mirror amplifier (CMA) having a common terminal connected to said first operating voltage terminal, an input terminal connected through said first current source to said second operating voltage terminal, and an output terminal connected through said second current source to said second operating voltage terminal;

an input transistor having a base-emitter junction connected between said input and common terminals of said CMA and a collector electrode;

a translation circuit input terminal for a signal voltage coupled to said collector electrode;

a translation circuit output terminal coupled to said output terminal of said CMA; and a second CMA having a common terminal connected to said second operating voltage terminal, an input terminal and an output terminal, the portion of said second CMA between its input and common terminals comprising said first current source and the portion of said second CMA between its output and common terminals comprising said second current source.

2. A signal translation circuit as set forth in claim 1, further including, connected between said translation circuit input terminal and said collector electrode of said input transistor, a voltage threshold circuit.

3. A signal translation circuit as set forth in claim 4, wherein said voltage threshold circuit comprises a semiconductor junction.

4. A signal translation circuit as set forth in claim 3, wherein said semiconductor junction comprises the base-emitter junction of another transistor, said base being connected to said translation circuit input terminal and said emitter being connected to said collector electrode of said input transistor, said another transistor also having a collector, said collector being connected to said second operating voltage terminal.

5. A signal translation circuit as set forth in claim 1, further including an output circuit connected between said output terminal of said first CMA and said first operating voltage source, said output circuit comprising a threshold circuit for accepting current flow from said second current source when the voltage at said collector electrode of said input transistor is lower than a given value.

6. A signal translation circuit as set forth in claim 1, further including a load, an output transistor having base, emitter and collector electrodes, connected at its base electrode to said output terminal of said first CMA, connected at its collector electrode to said second operating voltage terminal, and connected at its emitter electrode to said translation circuit output terminal and through said load to said first operating voltage terminal.

7. A signal translation circuit comprising:
first and second terminals for an operating voltage;
first and second current sources;
a first current mirror amplifier (CMA) comprising two transistors of the same conductivity type, one serving as the master transistor of said CMA and the other serving as a slave transistor, each transistor having base, emitter and collector electrodes and each connected at its emitter electrode to said first operating voltage terminal, said master transistor being connected at its base electrode to its collector electrode to the base electrode of said slave transistor, said master transistor being connected at its collector electrode through said first current source to said second operating voltage terminal, and said slave transistor being connected at its collector electrode through said second current source to said second operating voltage terminal;

an input transistor of the same conductivity type as said master and slave transistors and having base, emitter and collector electrodes, connected at its base electrode to the base electrode of said master transistor and at its emitter electrode to the emitter electrode of said master transistor;

a translation circuit input terminal for a signal voltage coupled to said collector electrode of said input transistor;

a translation circuit output terminal coupled to said collector electrode of said slave transistor; and a resistor and a second CMA, said second CMA having an input circuit and an output circuit, said input circuit in series with said resistor comprising said first current source and said output circuit comprising said second current source.

8. A signal translation circuit as set forth in claim 7, wherein said second CMA comprises fourth and fifth transistors of opposite conductivity type to the transistors of the first-mentioned CMA, each of said fourth and fifth transistors including base, emitter and collector electrodes, said emitter electrodes being connected to said second operating voltage terminal, the base and collector electrodes of said fourth transistor being connected to the base electrode of said fifth transistor and to the collector electrode of said master transistor, and the collector electrode of said fifth transistor being connected to the collector electrode of said slave transistor.

9. A signal translation circuit as set forth in claim 8, further including a sixth transistor of the same conductivity type as the transistors of the first-mentioned CMA, said sixth transistor having base, emitter and collector electrodes and being connected at its base electrode to the collector electrode of said slave transistor and at its collector electrode to said second terminal for an operating voltage source, and said emitter electrode of said sixth transistor being connected to said first operating voltage terminal.

10. A signal translation circuit as set forth in claim 9, further including a load, said load serving to connect the emitter electrode of said sixth transistor to said first operating voltage terminal.

11. A signal translation circuit comprising:
first and second current sources;
first and second operating voltage terminals;
a current mirror amplifier (CMA) having a common terminal connected to said first operating voltage terminal, an input terminal connected through said first current source to said second operating voltage terminal, and an output terminal connected through said second current source to said second operating voltage terminal;

an input transistor having a base-emitter junction connected between said input and common terminals of said CMA and a collector electrode;

a translation circuit input terminal for a signal voltage coupled to said collector electrode;

a translation circuit output terminal coupled to said output terminal of said CMA; and a second CMA having a common terminal connected to said second operating voltage terminal, an input terminal, said first and second output terminals, the portion of said second CMA between its first output terminal and its common terminal comprising said first current source, and the portion of said second CMA between its second output terminal and its common terminal comprising said second current source, and further including means supplying an input current to the input terminal of said second CMA.

12. A signal translation circuit comprising:
first and second current sources;
first and second operating voltage terminals;
a current mirror amplifier (CMA) having a common terminal connected to said first operating voltage terminal, an input terminal connected through said first current source to said second operating voltage terminal, and an output terminal connected through said second current source to said second operating voltage terminal;
an input transistor having a base-emitter junction connected between said input and common terminals and a collector electrode which is free to be driven by an input signal voltage over a voltage range which at one limit is such that said input transistor operates as an output transistor of said CMA in that the collector current flowing through said input transistor is controlled in current mirror fashion by the current flowing into said input terminal of said CMA, and which voltage range at its other limit is such that the collector electrode assumes a voltage level close to that at said first operating voltage terminal;
a translation circuit input terminal for a signal voltage coupled to said collector electrode; and
a translation circuit output terminal coupled to said output terminal.

13. A signal translation circuit as set forth in claim 12, further including a second CMA having a common terminal connected to said second operating voltage terminal, an input terminal and an output terminal, the portion of said second CMA between its input and common terminals comprising said first current source and the portion of said second CMA between its output and common terminals comprising said second current source.

14. A signal translation circuit as set forth in claim 12, further including a second CMA having a common terminal connected to said second operating voltage terminal, an input terminal, and first and second output terminals, the portion of said second CMA between its first output terminal and its common terminal comprising said first current source, and the portion of said second CMA between its second output terminal and its common terminal comprising said second current source, and further including means supplying an input current to the input terminal of said second CMA.

15. A signal translation circuit as set forth in claim 12, further including, connected between said translation circuit input terminal and said collector electrode of said input transistor a voltage threshold circuit.

16. A signal translation circuit as set forth in claim 15, wherein said voltage threshold circuit comprises a semiconductor junction.

17. A signal translation circuit as set forth in claim 16, wherein said semiconductor junction comprises the base-emitter junction of another transistor, said base being connected to said translation circuit input terminal and said emitter being connected to said collector electrode of said input transistor said another transistor also having a collector, said collector being connected to said second operating voltage terminal.

18. A signal translation circuit as set forth in claim 12, further including an output circuit connected between said output terminal of said CMA and said first operating voltage source, said output circuit comprising a threshold circuit for accepting current flow from said second current source when the voltage at said collector electrode of said input transistor is lower than a given value.

19. A signal translation circuit comprising:
first and second terminals for an operating voltage;
first and second current sources;
a current mirror amplifier (CMA) comprising two transistors of the same conductivity type, one serving as the master transistor of said CMA and the other serving as a slave transistor, having base, emitter and collector electrodes and each connected at its emitter electrode to said first operating voltage terminal, said master transistor being connected at its base electrode to its collector electrode to the base electrode of said slave transistor, said master transistor being connected at its collector electrode through said first current source to said second operating voltage terminal, and said slave transistor being connected at its collector electrode through said second current source to said second operating voltage terminal;
an input transistor of the same conductivity type as said master and slave transistors and having base, emitter and collector electrodes, connected at its base electrode to the base electrode of said master transistor and at its emitter electrode to the emitter electrode of said master transistor, said collector electrode of said input transistor being free to be driven by an input signal voltage over a voltage range which at one limit is such that said input transistor operates as a second slave transistor of said CMA and at its other limit is such that said collector electrode of said input transistor assumes a voltage level close to that at said first operating voltage terminal;
a translation circuit input terminal for a signal voltage coupled to said collector electrode of said output transistor; and
a translation circuit output terminal coupled to said collector electrode of said slave transistor.

20. A signal translation circuit as set forth in claim 19, further including resistor means and a second CMA, said second CMA comprising fourth and fifth transistors of opposite conductivity type to the transistors of the first-mentioned CMA, each of said fourth and fifth transistors including base, emitter and collector electrodes, said emitter electrodes being connected to said second operating voltage terminal, the base and collector electrodes of said fourth transistor being connected to the base electrode of said fifth transistor and via said resistor means to the collector electrode of said master transistor, and the collector electrode of said fifth transistor being connected to the collector electrode of said slave transistor.

21. A signal translation circuit as set forth in claim 20, further including a sixth transistor of the same conductivity type as the transistors of the first-mentioned CMA, said sixth transistor having base, emitter and collector electrodes and being connected at its base electrode to the collector electrode of said slave transistor and at its collector electrode to said second terminal for an operating voltage source, and said emitter electrode of said sixth transistor being connected to said first operating voltage terminal.

22. A signal translation circuit as set forth in claim 19, further including a threshold circuit connecting said translation circuit input terminal to said collector electrode of said input transistor.

23. A signal translation circuit as set forth in claim 19, further including a second output CMA having an input circuit and first and second output circuits, said first output circuit serving as said first current source and said second output circuit serving as said second current source, and further including a source of current connected to the input circuit of said second CMA.

24. A signal translation circuit comprising:
first and second current sources;
first and second operating voltage terminals;
a first current mirror amplifier (CMA) having a common terminal connected to said first operating voltage terminal, an input terminal connected through said first current source to said second operating voltage terminal, and an output terminal connected through said second current source to said second operating voltage terminal;
an input transistor having a base-emitter junction connected between said input and common terminals of said CMA and a collector electrode;
a translation circuit input terminal coupled to said collector electrode;
a translation circuit output terminal coupled to said output terminal;
a second CMA having a common terminal connected to said second operating voltage terminal, an input terminal, and first and second output terminals, the portion of said second CMA between its first output terminal and its common terminal comprising said first current source, and the portion of said second CMA between its second output terminal and its common terminal comprising said second current source;
a source of signal current supplying an input current to the input terminal of said second CMA;
a load; and
means for connecting and disconnecting said load between said translation circuit input terminal and said second terminal for said operating voltage.

* * * * *

UNITED STATES PATENT AND TRADEMARK OFFICE
CERTIFICATE OF CORRECTION

PATENT NO. : 4,140,977

DATED : February 20, 1979

INVENTOR(S) : Adel Abdel Aziz Ahmed

It is certified that error appears in the above-identified patent and that said Letters Patent is hereby corrected as shown below:

Col. 8, line 28, change "transistor" to --transistors--

Col. 9, line 27, change "claim 4" to --claim 2--

Col. 12, line 17, before "having base", insert

--each transistor--

Signed and Sealed this

Twenty-seventh Day of November 1979

[SEAL]

Attest:

RUTH C. MASON
Attesting Officer

LUTRELLE F. PARKER
Acting Commissioner of Patents and Trademarks

Disclaimer 4,140,977.—*Adel A. A. Ahmed,* Annandale, N.J. SIGNAL TRANSLATION CIRCUITS. Patent dated Feb. 20, 1979. Disclaimer filed Sept. 26, 1979, by the assignee, *RCA Corp.*

Hereby enters this disclaimer to claims 12 and 19 of said patent.

[*Official Gazette September 21, 1982.*]